US006545485B1

(12) United States Patent
Sanderson

(10) Patent No.: US 6,545,485 B1
(45) Date of Patent: Apr. 8, 2003

(54) ULTRASONIC PINPOINTER FOR POWER SYSTEM SOURCES OF INTERFERENCE

(75) Inventor: John D. Sanderson, Portland, OR (US)

(73) Assignee: Radar Engineers, Portland, OR (US)

( * ) Notice: Subject to any disclaimer, the term of this patent is extended or adjusted under 35 U.S.C. 154(b) by 0 days.

(21) Appl. No.: 09/489,279

(22) Filed: Jan. 21, 2000

Related U.S. Application Data

(60) Provisional application No. 60/116,717, filed on Jan. 21, 1999.

(51) Int. Cl.⁷ ............................................. G01R 31/12
(52) U.S. Cl. ........................ 324/536; 324/520; 324/529; 702/76; 702/77; 73/659
(58) Field of Search ................................. 324/536, 520, 324/542, 555, 76.21, 113, 501, 529; 702/57–62, 64–66, 69, 75–77, 191, 193, 195, FOR 103, FOR 104, FOR 106–108, FOR 134, FOR 166, FOR 168, FOR 170, FOR 171; 73/587, 658, 659

(56) References Cited

U.S. PATENT DOCUMENTS

| | | | |
|---|---|---|---|
| 3,592,967 A | | 7/1971 | Harris |
| 3,842,663 A | * | 10/1974 | Harting et al. ................ 73/593 |
| 4,006,410 A | * | 2/1977 | Roberts ....................... 324/113 |
| 4,279,019 A | | 7/1981 | Heyser |
| 4,391,142 A | | 7/1983 | Cantrell, Jr. et al. |

(List continued on next page.)

OTHER PUBLICATIONS

"Fisher Model XLG–90," 1994. Oct. 20, 1994.

Greb–Lasky et al., "Listening for Signs of Telltale Emissions," *Transmission & Distribution*, pp. 62–66, Nov. 1994.

"Ultrasonic Leak Locator Systems," *Communications Technology*, prior to Jan. 21, 2000.

Drapczuk, "Locating Corona By Ultrasound," *Maintenance Technology*, vol. 3, 1992. Feb. 1992.

"Ultraprobe Instruction Manual," prior to Jan. 21, 2000.

"NDT International, Inc., Ultrasonic Equipment and Supplies," 1996, 1997. No month available.

"Ultrasonic PD Sensor LDA–5/S," 1998. No month available.

(List continued on next page.)

*Primary Examiner*—Christine Oda
*Assistant Examiner*—Vincent Q. Nguyen
(74) *Attorney, Agent, or Firm*—Klarquist Sparkman, LLP

(57) ABSTRACT

An ultrasonic RFI source locator implements signal analysis to discriminate ultrasonic shocks emanating from power line equipment sources from ambient and other interference sources, as well as distinguish between specific type interference sources, such as corona and sparking discharge. The locator has a directional or contact ultrasonic sensor for receiving a signal representing the ultrasonic shocks from a targeted source, and includes signal processing circuitry to detect and compare the strengths of portions of the sensed signal that are modulated at whole integer multiples (harmonics) of an electrical power frequency (e.g., at 60 Hz and 120 Hz on a 60 Hz A/C power system, or 50 Hz and 100 Hz on a 50 Hz A/C power system) with each other, with the total signal and with selected non harmonic frequencies. The locator provides an operator indication of the result of this spectral analysis.

32 Claims, 10 Drawing Sheets

U.S. PATENT DOCUMENTS

| | | | |
|---|---|---|---|
| 4,439,723 A | | 3/1984 | Loftness |
| 4,635,042 A | | 1/1987 | Andrews |
| 4,785,659 A | | 11/1988 | Rose et al. |
| 4,823,600 A | | 4/1989 | Biegel et al. |
| 5,025,208 A | * | 6/1991 | Danzeisen ............... 324/76.12 |
| 5,089,997 A | | 2/1992 | Pecukonis |
| RE33,977 E | | 6/1992 | Goodman et al. |
| 5,231,355 A | * | 7/1993 | Rider et al. ................. 324/326 |
| 5,361,029 A | * | 11/1994 | Rider et al. ................. 324/326 |
| 5,437,178 A | | 8/1995 | Esin et al. |
| 5,477,150 A | * | 12/1995 | Ham et al. ................... 324/501 |
| 5,499,189 A | | 3/1996 | Seitz |
| 5,608,328 A | | 3/1997 | Sanderson |
| 5,657,244 A | | 8/1997 | Seitz |
| 6,219,390 B1 | * | 4/2001 | Prasanna ................... 375/346 |

OTHER PUBLICATIONS

"Hotstick Line Sniffer, Model 247," *Radar Engineers,* prior to Jan. 21, 2000.

"LP700B–15, Ultrasonic Leak Locating System," *Safety Products,* 1987. No month available.

"Hall Corona Detector," *Lumidor Products Corporation,* prior to Jan. 21, 2000.

"Corona Gun, Model MI–766," *Multi–Amp Corporation,* 1990. No month available.

"Ultrasonic Leak Location Systems," 1972. No month available.

"Acoustic Partial Discharge Analyzer", pp 1–5, *Diagnostic Monitoring Systems and Services,* Jan. 1999.

* cited by examiner

SPARK RFI EVENT

MICROSPARK RFI EVENTS

NON-
SYMMETRICAL
MICROSPARK
RFI EVENTS

ULTRASONIC PINPOINTER FOR POWER SYSTEM SOURCES OF INTERFERENCE

CROSS-REFERENCE TO RELATED APPLICATION

This application is based on co-pending provisional U.S. Patent Application No. 60/116,717, filed Jan. 21, 1999.

BACKGROUND

1. Field of the Invention

This invention relates to locating RFI sources on power distribution and transmission systems.

2. Description of the Prior Art

Sparks on/in power system equipment are a significant source of radio frequency interference (RFI). When these RFI sources are of sufficient strength they can disrupt radio and TV reception and all types of radio communications. This leads to complaints to the operator of the power system and the source must be found and corrected. Often the RFI source is a faulty device or appliance in the home or office of the complaining party. However a significant percentage of RFI sources are caused by faulty devices or equipment on the power distribution/transmission system itself. Generally these sources are found on the overhead cables and associated equipment that distribute commercial electrical power.

After receiving a complaint the power company personnel typically locate the pole or structure from which the RFI is originating with special radio direction finding (RDF) equipment. Then they use very short range radio or ultrasonic detectors to pinpoint the source. For many years attempts have been made to design ultrasonic detectors with sufficient sensitivity, directivity and reliability to locate the spark RFI source from the ground, thus eliminating the need for a bucket truck and line crew to locate the fault. The limiting factor has been the achievable sensitivity and signal to noise ratio (S/N).

SUMMARY OF THE INVENTION

The present invention is a pinpointer, locator or detector of RFI event sources, with increased discrimination of power system RFI sources from random, ambient and other sources. This improved discrimination provides benefits in reducing the time and cost required to locate an RFI source on a power system. This and other improvements are achieved by taking into account the specific ultrasonic characteristics, or signatures, of power system line RFI sources so that they can be discriminated from background noise.

As in the prior art, some embodiments of the invention use a parabolic reflector to focus ultrasonic wave energy on a microphone mounted at the reflector focal point, although alternatively other types of ultrasonic sensors (such as direct contacting stethoscope probes) can be used. Unlike prior art, which typically treated the fundamental technical problem as one of detecting certain ultrasonic frequencies emitted by spark sources and mixing them down to provide audio indication to the operator, the concept of the invention evolved from understanding that the ultrasonic energy coming from the spark is essentially a series of shock waves in the atmosphere, rather than any particular ultrasonic frequency, and that these shock waves arrive at the microphone in predictable patterns directly related to the frequency of the AC power system and to the type of interference source from which they emanate.

The shock waves are converted to an alternating electrical voltage by a piezo ceramic transducer that resonates at an ultrasonic frequency when stimulated by the atmospheric shock wave. This signal is then amplified and filtered to remove out of band noise such as internal electronic noise and external radio noise picked up by the circuits. The signal then goes to a logarithmic amplifier/detector circuit, the output of which is a voltage proportional to the log base 10 of the AC input signal level. The time constants in the detector are adjusted so that it amplitude demodulates the ultrasonic frequency, thereby providing a signal with bandwidth from DC up to an upper cutoff frequency chosen for optimum system performance. The AC output of the amplifier/detector is sent to the AC amplifier and the bandpass filters, the outputs of which are converted to proportional DC voltages by active rectifiers. (The filter pass bands are designed for the frequency of the power system that the instrument will be used on, generally either 60 HZ or 50 HZ. If the instrument is to be used on more than one type of system the filter pass bands can be designed to be switchable.) The DC voltages from the bandpass-rectifier paths are then compared to each other and the DC output of the AC amplifier-rectifier path by a bank of comparator circuits. The resulting high/low comparator outputs are combined and screened logically so that when a predefined condition is met, based on prior analysis of signals collected from power line RFI sources, an indicator light is turned on to notify the operator. At the same time the unfiltered outputs of the bandpass-rectifier circuits, now providing higher harmonics of the power line frequency in the audible range, are fed to an audio amplifier and speaker. The sound amplitude and timbre from the speaker advise the operator, in a relatively gross way, of what is coming in through the microphone. At the same time the output of one or more of the bandpass-rectifiers (depending on mode of operation) is used to drive a signal strength meter which gives the operator a more precise indication of the strength of the power line component of the received signal.

The meter and light indicators are attached to the parabolic reflector in such a way that they are easily visible to the operator while sighting to point the highly directional parabolic microphone unit.

When practicing the invention the operator will usually have identified a particular pole or structure from which the RFI is emanating using RDF equipment. Standing at ground level, he/she will then point the ultrasonic parabolic microphone with one piece integrated electronics, meter, indicator and speaker, at various suspect devices on the pole until a spark source is identified by the speaker and meter and confirmed by the indicator light. The operator will then scan the pole from various angles to confirm which of various closely spaced items is the faulty component. Typically the operator will have to work with high levels of ambient ultrasonic noise, such as from traffic, wind, rustling leaves, etc. Since these noise sources will not have the. specific spectral characteristics of power line sources the indicator will not illuminate (or sound in the case of an audio indicator). Also, because of the response characteristics of the logarithmic amplifier/detector, the speaker and meter will both tend to quiet in the presence of loud out-of-band noise, further enhancing ease of operation.

It is anticipated that the invention will be used mostly for locating spark RFI sources, but the same fundamentals apply to corona RFI. In fact, since there are predictable differences in the signals emitted from sparks and corona, a variation of the invention can be used to distinguish between them. For example, a transmission tower may have a spark RFI source which is interfering with local UHF reception and at the same time, because of the high voltage, a corona RFI is present which is chronic but not a source of complaint. The operator has located the tower with RDF equipment which is not precise enough to locate the specific faulty device causing the spark. Using the invention he can select a logic mode to "see" only spark type sources. This was not possible with the prior art.

Additional features and advantages will be made apparent from the following detailed description of the illustrated embodiment which proceeds with reference to the accompanying drawings.

DETAILED DESCRIPTION

Figure 1:
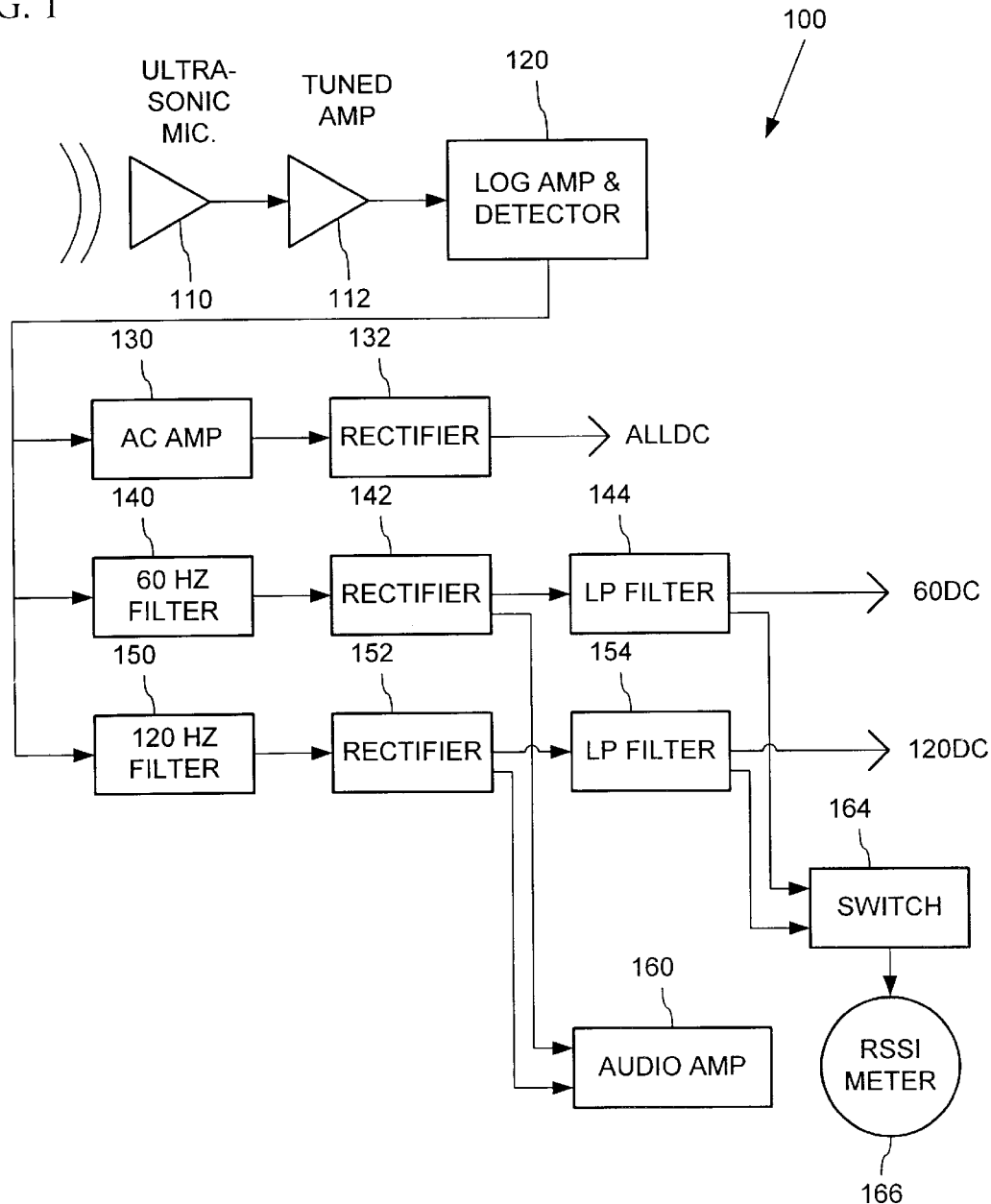
FIGS. 1 and 2 are a block diagram of an electronic circuit of an ultrasonic pinpointer in accordance with one embodiment of the invention.
Figure 2:
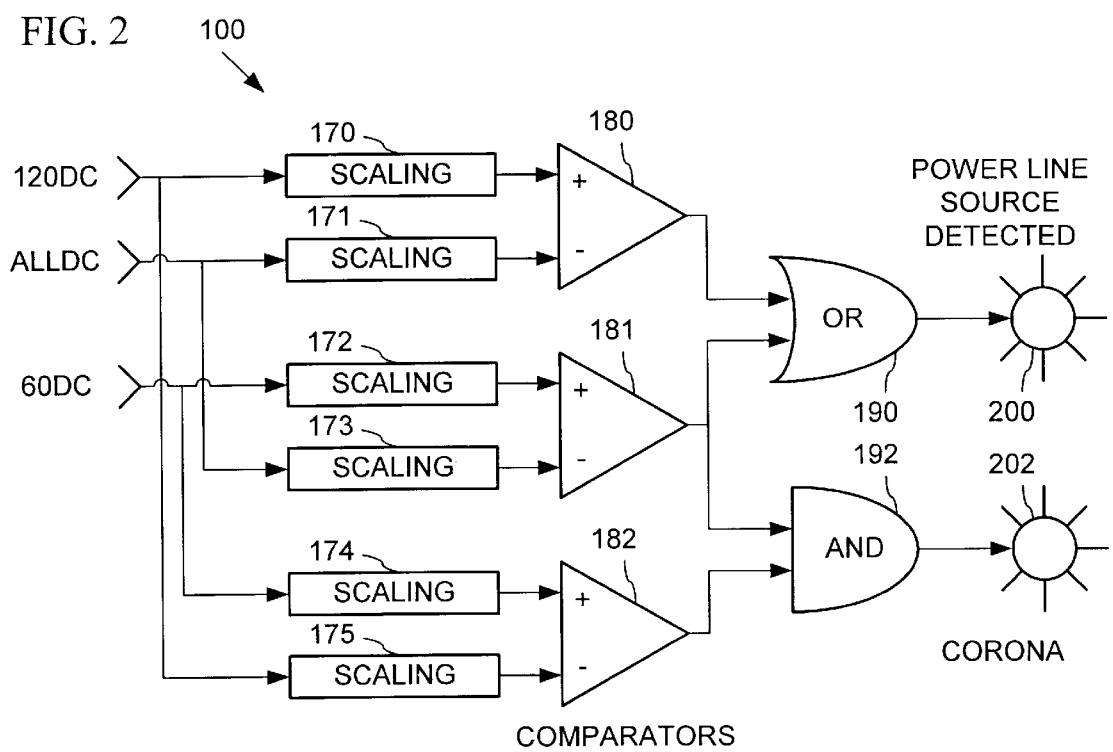

With reference to FIGS. 1 and 2, an ultrasonic pinpointer embodying the invention as illustrated herein implements signal analysis to distinguish ultrasonic signals emanating from power line sources (e.g., sparking and corona) in contrast to other ultrasonic noise sources. The illustrated ultrasonic pinpointer preferably is one-piece handheld instrument that includes an ultrasonic sensor, a parabolic reflector (e.g., 18 inch diameter parabola-shaped dish), and a receiver circuit 100 (FIGS. 1 and 2). The ultrasonic sensor or microphone 110 (FIG. 1) in the illustrated ultrasonic pinpointer is a piezo ceramic transducer that resonates at an ultrasonic frequency when stimulated by the atmospheric shock wave, and converts the shock wave to an electrical voltage. Embodiments of the ultrasonic sensor employing a parabolic reflector are particularly adapted to directional location of RFI sources from over-head power system sources.

Figure 7:
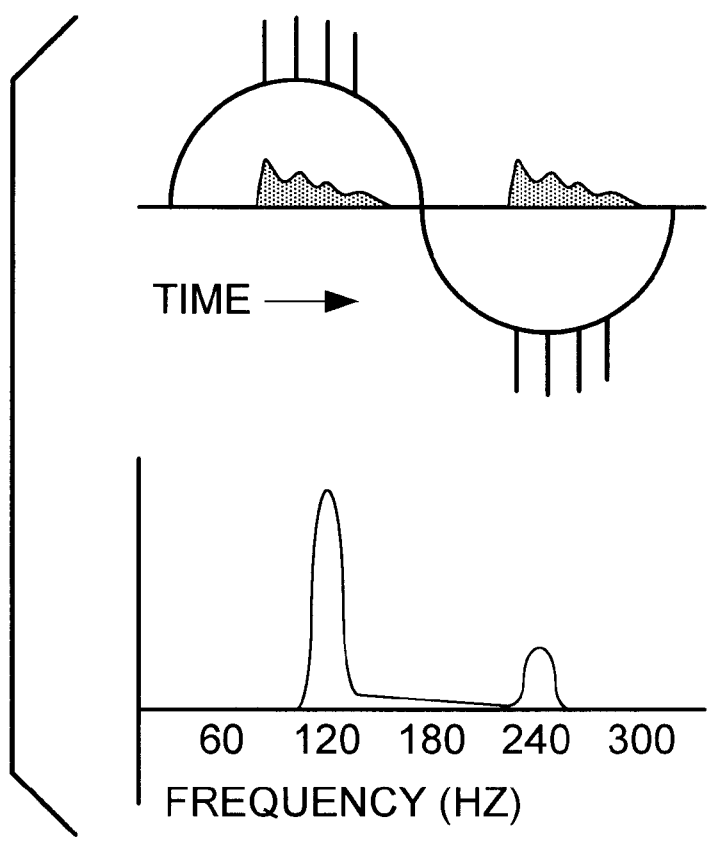
FIG. 7 depicts time and frequency domain graphs illustrating RFI events from a power system micro-spark source.
Figure 8:
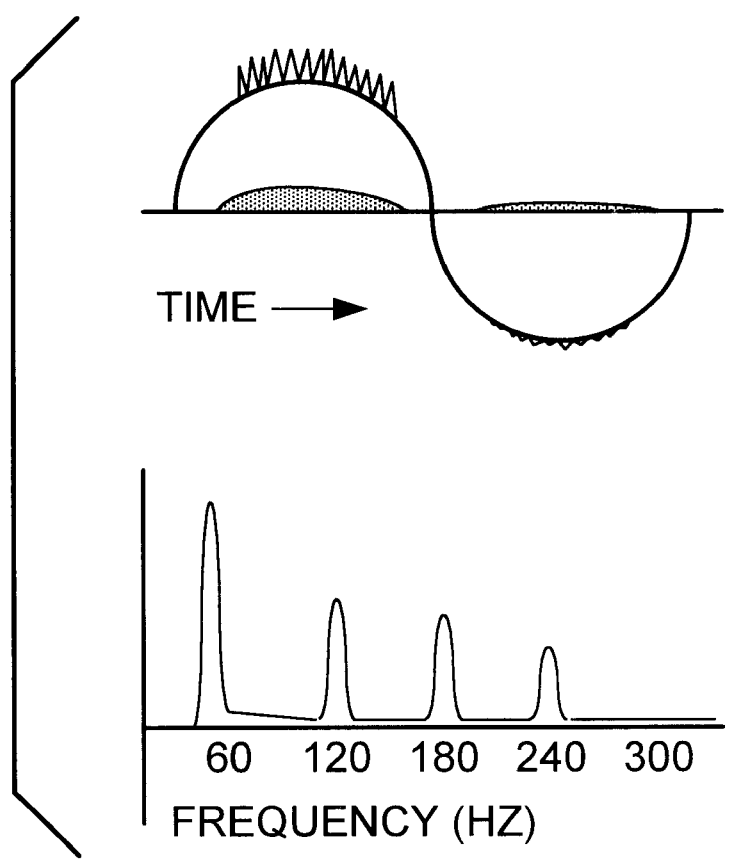
FIG. 8 depicts time and frequency domain graphs illustrating RFI events from a power system corona source.
Figure 9:
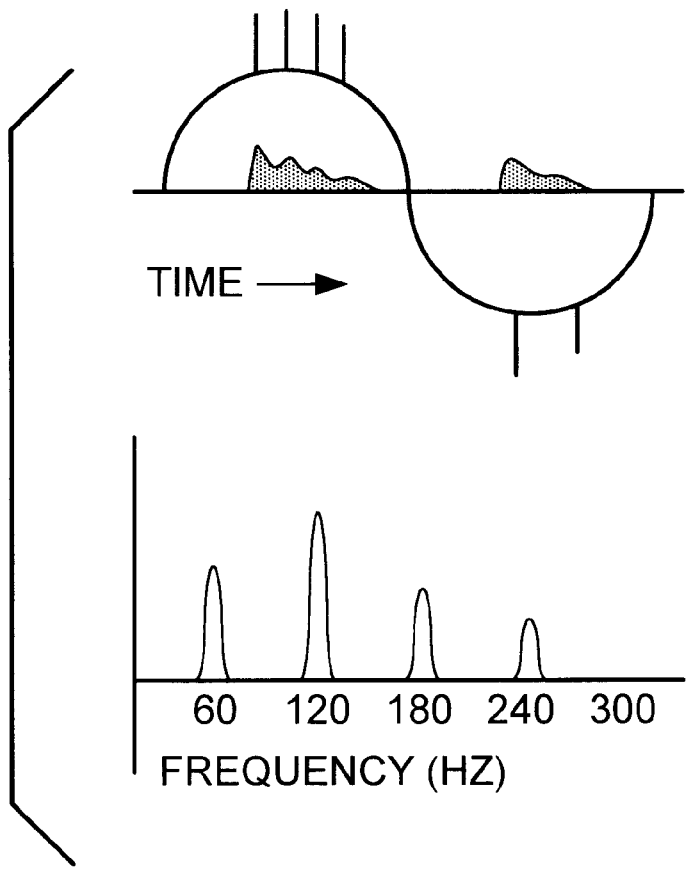
FIG. 9 depicts time and frequency domain graphs illustrating RFI events from a power system non-symmetrical micro-spark source.

Alternatively, a stethoscope probe or like contacting ultrasonic sensor can be used in place of the parabolic reflector, such as to locate an RFI source on underground power system equipment by direct contact of such probe or sensor to the equipment or proximity. The direct contacting stethoscope probe has particular application as a diagnostic tool for preventative maintenance of underground and like power lines. For example, there are splices in underground power lines that may have microscopic voids (with sizes on the order of microns) which experience micro-discharges during the power signal cycle (time and frequency domain graphs of which are shown in FIGS. 7 and 9). These discharges can degrade the power line by causing additional new voids, and may eventually cause an electrical tree. The illustrated ultrasonic pinpointer with contacting ultrasonic sensor thus can be used for early detection of such defects.

With reference now to FIG. 1, the receiver circuit 100 of the ultrasonic pinpointer includes a tuned amplifier 112 and a logarithmic amplifier/detector 120 connected to the ultrasonic microphone 110. The tuned amplifier 112 amplifies and filters the electrical voltage signal produced by the ultrasonic microphone 110 to remove any out of band noise such as internal electronic noise and external radio noise picked up by the receiver circuit 100. Following which, the logarithmic amplifier/detector 120 further amplifies the signal and outputs a voltage proportional to the log base 10 of the signal at its input. The time constants in the detector 120 are adjusted. so that the detector amplitude demodulates the ultrasonic frequency, thereby providing a signal with bandwidth from DC up to an upper cutoff frequency chosen for optimum system performance.

Connected after the logarithmic amplifier/detector 120 in the receiver circuit 100 are an AC amplifier 130, a 60 Hz bandpass filter 140 and a 120 Hz bandpass filter 150. The AC amplifier 130 and bandpass filters 140, 150 are connected to a rectifier 132 and rectifiers 142, 152, respectively, which operate to convert the signal in the respective pass bands to proportional DC voltages. The pass bands of the bandpass filters 140, 150 are designed for primary and first harmonics of the frequency of the power system that the instrument will be used on, generally either 60 HZ or 50 HZ. Accordingly, the pass bands for a 50 Hz power system would be 50 and 100 Hz. If the instrument is to be used on more than one type of system the filter pass bands can be designed to be switchable. Low pass filters 144 and 154 also are connected after the rectifiers 142, 152 to further smooth the DC output. The resulting DC voltages are proportional to the ultrasonic shock waves picked up by the parabolic reflector and ultrasonic microphone as a whole (called the "ALLDC" signal), the portion of the ultrasonic shock waves modulated at 60 Hz (called the "60DC" signal), and the portion of the ultrasonic shock waves modulated at 120 Hz (called the "120DC" signal). The latter proportions are the portions of the ultrasonic shock waves due to power system frequency (e.g., the 60 and 120 Hz frequencies) sources of such disturbances.

The unfiltered output of the rectifiers 142, 152 drives an audio amplifier and speaker 160 to produce an audible indication of the 60 and/or 120 Hz ultrasonic sources being picked up by the illustrated ultrasonic pinpointer. The sound amplitude and timbre from the speaker advise the operator, in a relatively gross way, of what is coming in through the microphone. Depending on the mode selected with a switch 164 (which may be a double pole single throw manual toggle switch), either one of the low pass filters 144, 154 is connected to a signal strength indicating meter 166 through the switch 164, which provides a more precise visual indication of the relative strength of the component of the ultrasonic disturbances from power system frequency (e.g., 60 Hz and 120 Hz) sources.

With reference now to FIG. 2, a set of scaling circuits 170–175, comparators 180–182, and logic gates 190, 192 implement a further logical signal analysis for determining whether the sensed ultrasonic disturbances have the characteristic of a power system source, and then illuminating corresponding LED. indicators 200, 202. The scaling circuits 170–173 and the comparators 180, 181 and the logic gate 190 compare the 60DC and 120DC voltages to the ALLDC voltage to determine whether more than a significant proportion of the sensed ultrasonic disturbances are at a power system frequency. If more than a threshold proportion of the sensed ultrasonic signal is modulated at 60 or 120 Hz (e.g., the 60DC or 120DC voltages are more than some fraction, such as half or a third, of the ALLDC voltage), then the LED 200 is lit to indicate the sensed ultrasonic emanations are from a power system source.

On the other hand, the scaling circuits 172–175, the comparators 181–182 and logic gate 192 compare the 60DC and 120DC voltages to each other. In general, sparking discharges from a power line tend to occur on both halves of the electrical power cycle, whereas corona discharges tend to occur only once per cycle. Accordingly, the ultrasonic shock waves produced from the sparking discharges tend to be modulated more strongly at twice the power system frequency (e.g., 120 Hz), whereas those from corona tend to be modulated more strongly at the power system frequency (e.g., 60 Hz). Accordingly, if the 60 Hz component is greater than the 120 Hz component and the 60 Hz component is a significant portion of the whole ultrasonic disturbance, then this part of the signal analysis circuit lights the LED 202 to indicate a corona discharge source.

The meter and light indicators are located on the illustrated ultrasonic pinpointer in such a way that they are easily visible to the operator while sighting to point the pinpointer. With the additional processing of the sensed ultrasonic signal to detect the component thereof modulated at the power system frequency and its harmonics, the illustrated ultrasonic pinpointer more accurately discriminates power system faults from other background ultrasound sources.

When practicing the invention, the operator will usually have identified a particular pole or structure from which the RFI is emanating using RDF equipment. Standing at ground level, he/she will then point the ultrasonic reflector of the illustrated ultrasonic pinpointer at various suspect devices on the pole until a spark source is identified by the speaker and meter and confirmed by the indicator light. The operator will then scan the pole from various angles to confirm which of various closely spaced items is the faulty component. (Alternatively, where a contacting ultrasonic sensor such as a stethoscope probe is used, the operator directly contacts suspect equipment or proximity at various places with the sensor or probe.) Typically the operator will have to work with high levels of ambient ultrasonic noise, such as from traffic, wind, rustling leaves, etc. Since these noise sources will not have the specific spectral characteristics of power line sources the indicator will not illuminate (or sound in the case of an audio indicator). Also, because of the response characteristics of the logarithmic amplifier/detector, the speaker and meter will both tend to quiet in the presence of loud out-of-band noise, further enhancing ease of operation.

Figure 3:
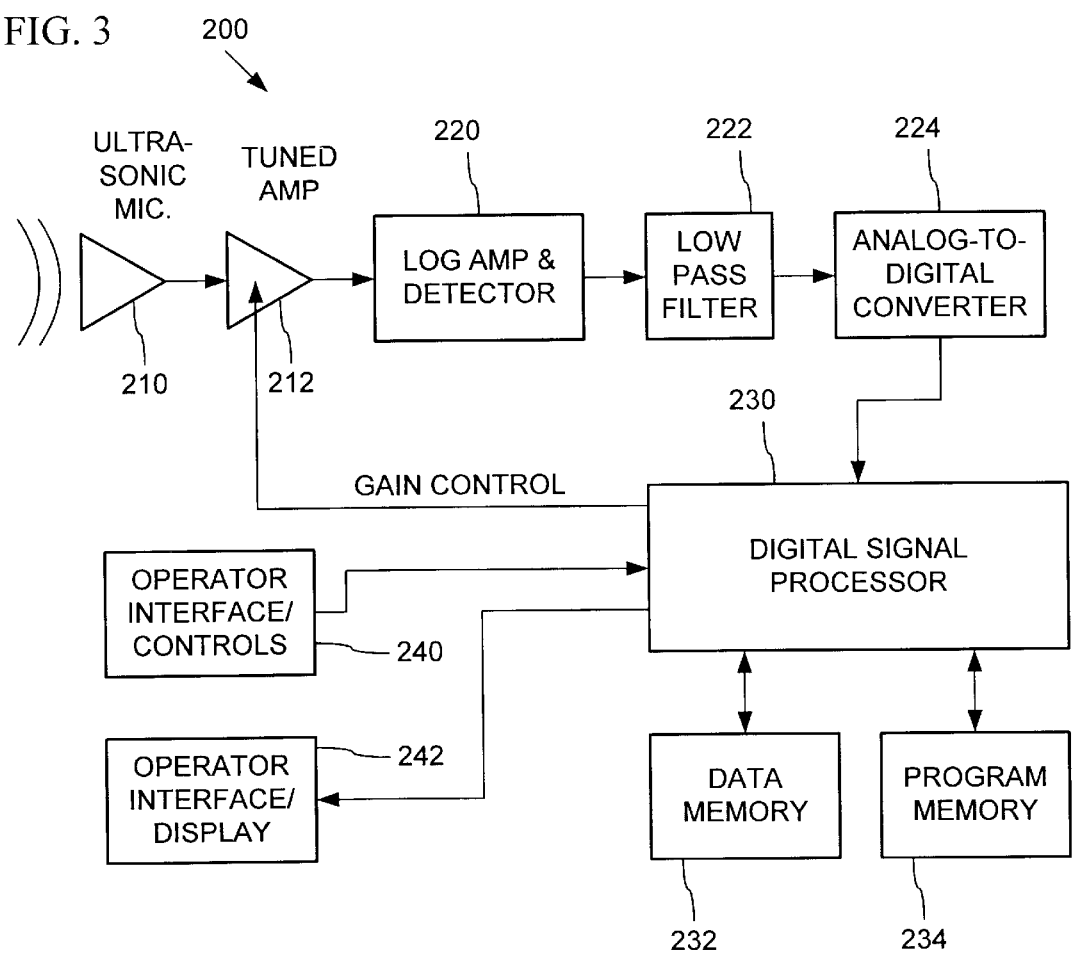
FIG. 3 is a block diagram of an electronic circuit of an ultrasonic pinpointer according to an alternative embodiment of the invention, which employs a digital signal processor.
Figure 4:
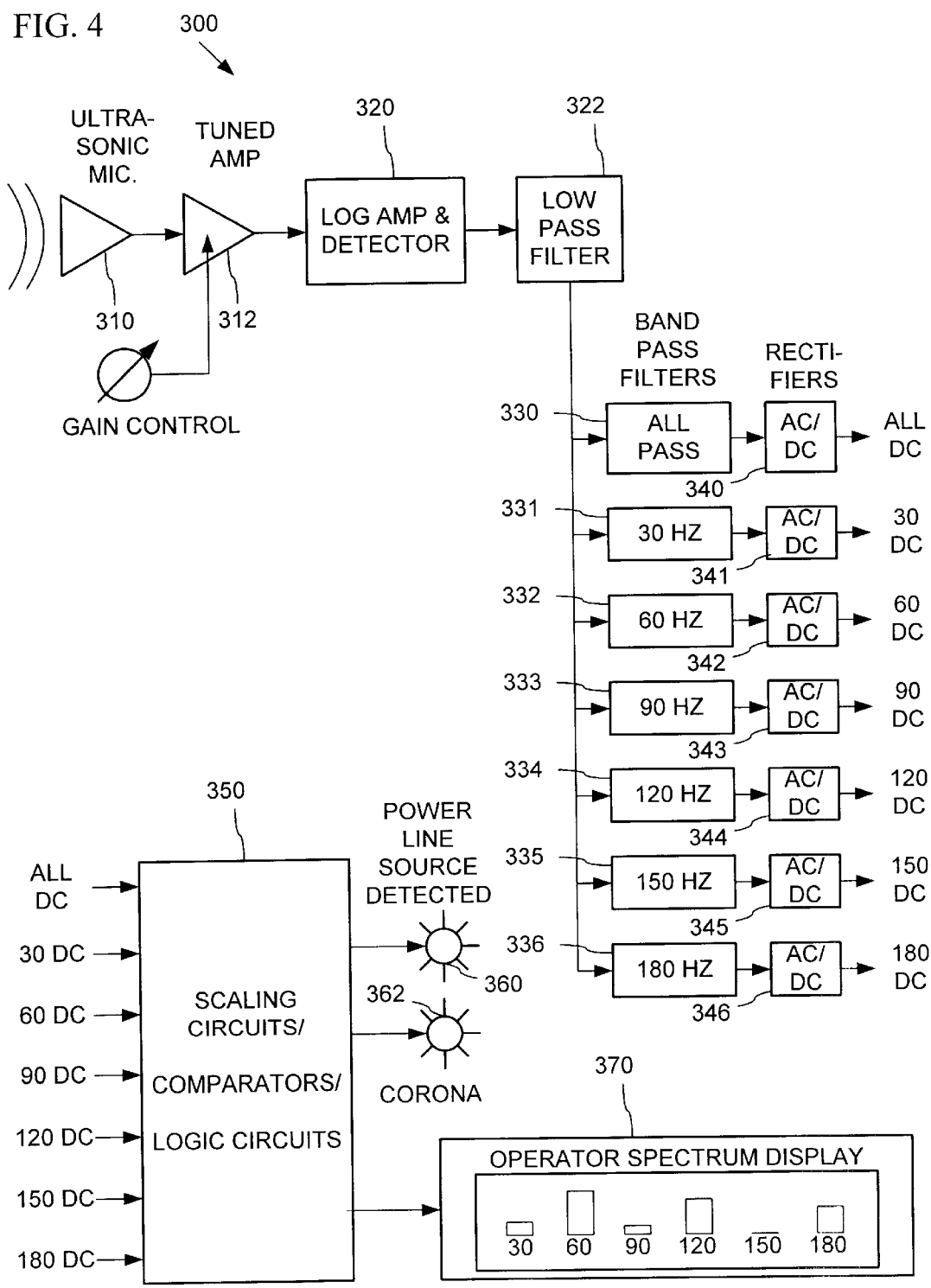
FIG. 4 is a block diagram of an electronic circuit of an ultrasonic pinpointer according to a further alternative embodiment of the invention, which employs a analog signal processor.

In alternative embodiments of the ultrasonic pinpointer shown in FIGS. 3 and 4, additional frequency components of the sensed signal can be detected, such as at intervals about additional harmonics of the power system frequency and at selected frequencies not related to the power line frequency. For example, the alternative embodiment shown in FIG. 4 detects frequency components at 30, 60, 90, 120, 150, and 180 Hz. These additional detected frequency components form a signature that can be used to improve discrimination of power line sources from random noise and also to differentiate between various types of power line sources. In such embodiments, the indication of a power line source can be based on a comparison between the various frequency components, rather than comparing the power system frequency-related components (e.g., 60 Hz and 120 Hz) to an aggregate measure of the sensor signal as in the embodiment of FIGS. 1 and 2. For example, the criteria for the indication of a power system-related RFI source in the embodiment of FIG. 4 can be that the power system frequency-related components are greater than the non-power system frequency-related components (i.e., that the 60 Hz and 120 Hz frequency components are greater than the 30, 90, 150, etc. components).

With reference to FIG. 3, a receiver circuit 200 in an alternative embodiment of the ultrasonic pinpointer can be implemented using a digital signal processor 230 which samples the output from the ultrasonic microphone 210, tuned amplifier 212, and logarithmic amplifier/detector 220 via an analog-to-digital converter 224; and uses the Fast Fourier Transform (FFT), or other calculation process, to calculate a spectrum of the demodulated and sampled ultrasonic signal. The digital signal processor 230 is programmed to perform the FFT via a program stored in program memory 234, which implements the FFT calculation on the sampled output stored in a data memory 232. With appropriate FFT parameters, the FFT can yield a spectrum (also referred to as a "spectral signature") that includes values proportional to the ultrasonic shock waves modulated in each of a set of consecutive frequency ranges (e.g., at 20 Hz intervals across a range that includes the power system frequency and multiple harmonics thereof, such as from 0 Hz to 400 Hz. Extending the upper frequency limit provides better discrimination of different types of power line RFI sources. The practical upper frequency limit is determined by the ultrasonic transducer response and the digital signal processor speed and power.) A computerized logic analysis comparing the power system frequency components to a calculated average or aggregate value of the spectrum similar to the analysis depicted in FIG. 2 and discussed above for the filter-based embodiment can then be used to discriminate power system sources from other sources. Alternatively, as discussed above, the power system frequency components can be compared to the non-power system frequency components to provide the discrimination between power system and other RFI sources (such as by providing the indication of a power system RFI source if one or more of the power system frequency components are greater than all other frequency components). Alternatively, the spectrum can be compared to known one or more stored reference spectra (e.g., a spectrum obtained empirically in the lab or field of a typical defective power system equipment source) using conventional techniques to calculate a similarity measure of spectral signatures (e.g., sum of squares of differences between the spectra in each interval). When the ultrasonic signal sensed by the pinpointer is sufficiently similar to a stored spectrum of interest (e.g., the similarity measure is greater than a threshold), an aural, visual or other indication is provided.

With reference to FIG. 4, an analog signal processing receiver circuit 300 in a further alternative embodiment of the ultrasonic pinpointer also provides discrimination of power system RFI sources based on a spectrum including both power system-related and other frequency components. This receiver circuit 300 includes a bank of band pass filters 330–336 and rectifiers 340–346 to form DC voltage signals representative of a set of frequency components (ALL, 30 Hz, 60 Hz, 90 Hz, 120 Hz, 150 Hz, and 180 Hz) of an output from an ultrasonic microphone 310, tuned amplifier 312, logarithmic amplifier and detector 320, and low pass filter 322. Similar to the embodiment of FIGS. 1 and 2, the DC voltage signals are fed to a set of scaling circuits, comparators and logic circuits 350, which light a power line source indication LED 360, corona LED 362 and operator spectrum display 370 based on the comparison of the DC signals in the logic circuits 350. The logic circuits can base the LED indications on a comparison of the power system frequency components (e.g., the "60 DC" and "120 DC" signals) to the aggregate measure of the sensed signal (the "ALL DC" signal), and/or comparison of the power system frequency components to the other frequency components (e.g., the "30DC," "90 DC," and "150DC" signals). For example, the logic circuits 350 can provide the power line source indication (with LED 360) when the "60DC" or "120DC" signals are more than a given proportion of the "All DC" signal, and the corona indication (with LED 362) when the "60DC" signal is greater than the "120DC" signal, as in the embodiment of FIGS. 1 and 2. Alternatively, the logic circuits 350 can provide the power line source indication (with LED 360) if either the "60DC" or "120DC" signal are greater than the other frequency component signals (i.e., the "30DC," "90 DC," and "150DC" signals). The operator spectrum display provides a direct display of the frequency components in the ultrasonic signal's spectrum for operator review.

Figure 5:
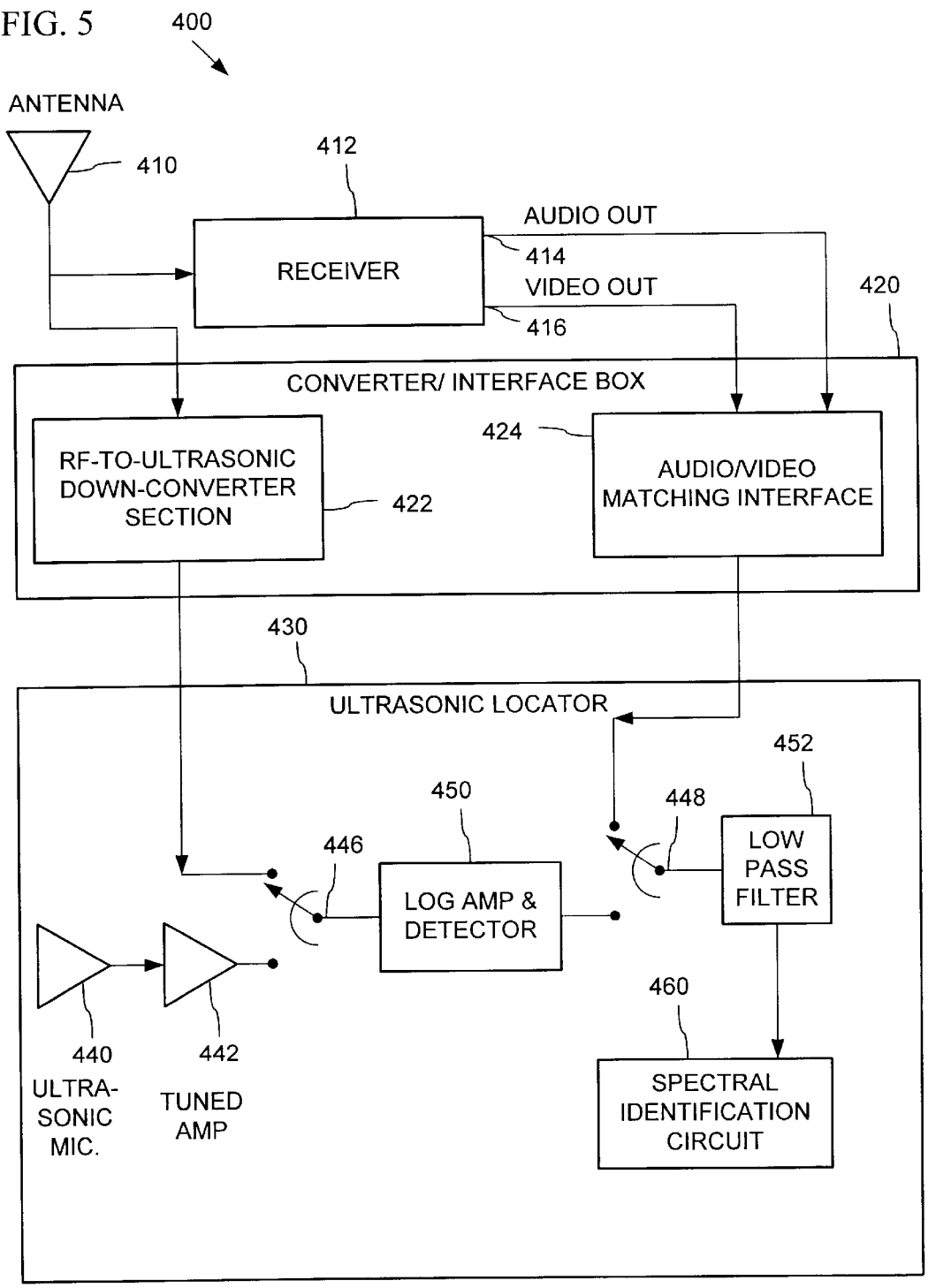
FIG. 5 is a block diagram of an ultrasonic pinpointer used with an RF/audio/video-to-ultrasonic frequencies converter/interface to capture a reference spectrum.
Figure 6:
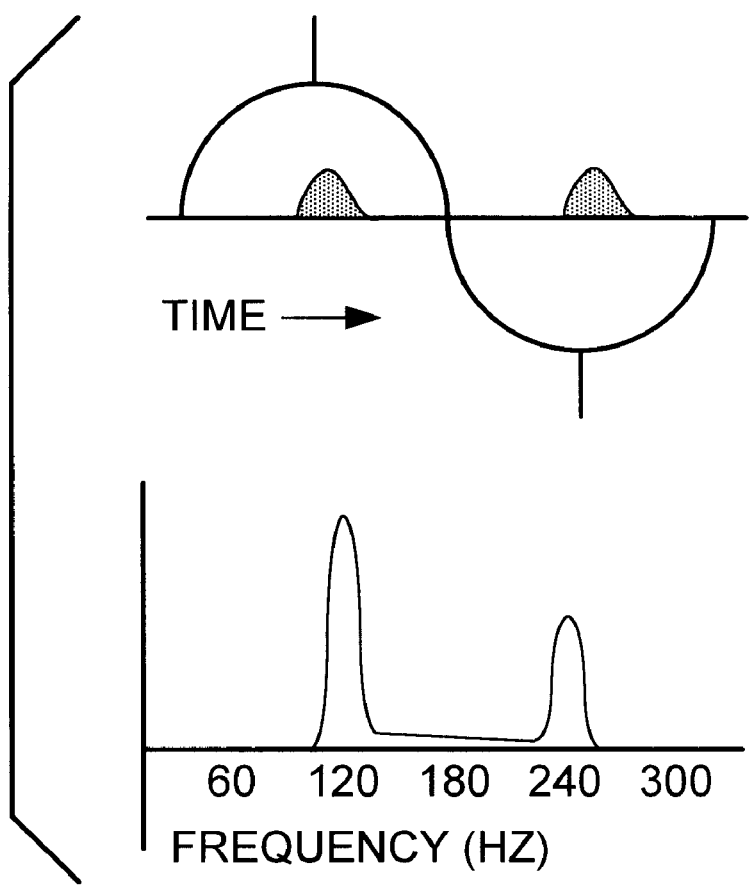
FIG. 6 depicts time and frequency domain graphs illustrating RFI events from a power system spark source.

With reference now to FIG. 5, in practice, the operator can use the alternative ultrasonic pinpointer 430 (which bases the discrimination on a proximity measure comparison against a reference spectrum as described above) to locate a specific source of interference to a complaining (or other) party's equipment. The operator connects the ultrasonic pinpointer's receiver circuit, through an adapter circuit (i.e., the RF-to-ultrasonic down-converter 422 housed in a converter interface box 420), to an antenna of the equipment, and stores the spectrum received through the antenna as a reference spectrum (e.g., in the data memory 232 of the receiver circuit 200 of FIG. 3). The down-converter section 422 converts (such as by mixing) the radio frequency signal at the antenna down to the ultrasonic frequency range, such as would be sensed at the ultrasonic microphone 440 of the ultrasonic locator 430. Alternatively, the receiver circuit of the ultrasonic locator 430 can be connected via an audio/video matching interface 424 to an "audio out" or "video out" output of the complaining party's receiver 412. This audio/video matching interface 424 also converts the audio or video out signals (e.g., via appropriate scaling, shifting and/or filtering) to the frequency range for input to the ultrasonic locator's receiver circuit. The appropriate source input for this alternative ultrasonic locator 430 is selected by the operator by appropriately setting switches 446 and 448 to pass the desired input ultrasonic sensing signal to a spectral identification circuit 460 (which can be implemented using a digital signal processor 230 as in the embodiment shown in FIG. 3, or as analog filtering circuits as in the embodiment shown in FIG. 4).

Then, with the receiver circuit reconnected to the directional ultrasonic reflector (by setting the switches 446, 448 to pass the signal from the ultrasonic microphone 440 and the tuned amplifier 442), the operator points the ultrasonic pinpointer at suspect sources of the interference in the vicinity. The ultrasonic pinpointer compares the spectrum of the sensed ultrasonic signal to the stored reference spectrum and provides an indication to the operator (which may be a display scale showing the degree of similarity or a simple yes/no indication) when a source with a sufficiently similar spectral signature is targeted by the operator based on a proximity measure of the two spectra.

Figure 10:
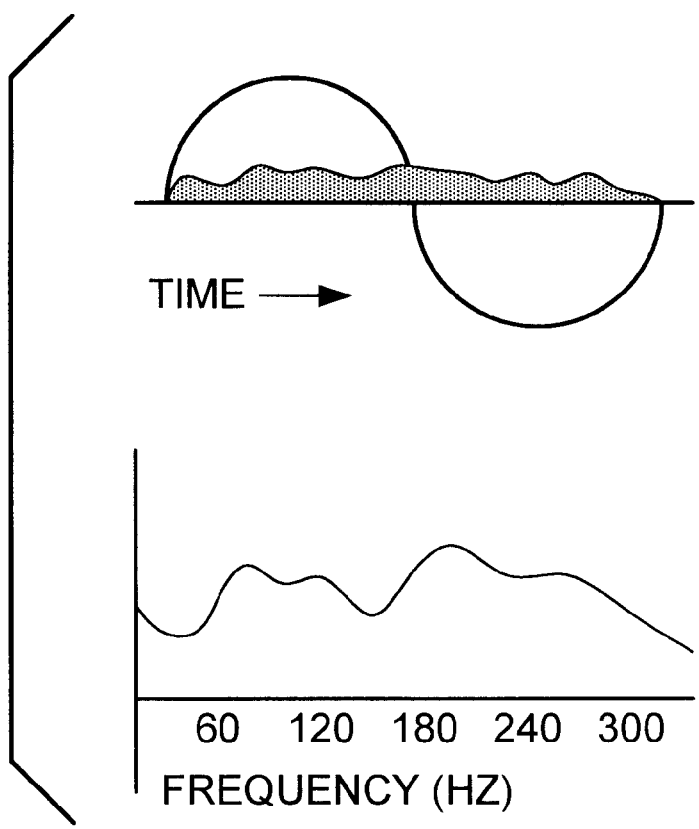
FIG. 10 depicts time and frequency domain graphs illustrating RFI events from a random ultrasonic noise source or sources.

FIGS. 6 through 10 illustrate ultrasonic signals in both the time and frequency domains that are produced by various types of RFI sources. The time domain graphs show the ultrasonic signals that would be sensed at the ultrasonic microphone of the ultrasonic pinpointer. Also, a representation of a single cycle of the power system signal with the RFI events is shown superimposed over the ultrasonic signal. The frequency domain graphs show the frequency spectrum of the resulting ultrasonic signal produced from the RFI events. FIGS. 6 through 9 represent various power system RFI events, including sparking discharge, microsparking discharges, corona and non-symmetric microsparking discharges. FIG. 10 represents an ambient, background ultrasonic noise signal, such as may be produced from wind, leaves, passing cars, etc. The graphs are representative of the respective signals only, and not intended to be accurately scaled.

Having described and illustrated the principles of our invention with reference to an illustrated embodiment, it will be recognized that the illustrated embodiment can be modified in arrangement and detail without departing from such principles. It should be understood that the programs, processes, or methods described herein are not related or limited to any particular type of electronic circuit or signal processing apparatus, unless indicated otherwise. Various types of general purpose or specialized signal processing apparatus may be used with or perform operations in accordance with the teachings described herein. Elements of the illustrated embodiment shown in circuit form may be implemented in software or firmware on a general computer processor and vice versa.

In view of the many possible embodiments to which the principles of our invention may be applied, it should be recognized that the detailed embodiments are illustrative only and should not be taken as limiting the scope of our invention. Rather, we claim as our invention all such embodiments as may come within the scope and spirit of the following claims and equivalents thereto.

I claim:

1. A method of discriminating power system sources of interference from ambient interference and other interference sources, the method comprising:
   sensing a signal from a targeted source;
   spectrally analyzing the sensed signal to detect a spectral characteristic related to power system interference sources, wherein said spectrally analyzing comprises:
      detecting a portion of the sensed signal occurring within a frequency interval related to a power system frequency; and
      providing the operator indication representative of a magnitude of said detected portion; and
   providing an operator indication when the spectral characteristic is detected.

2. The method of claim 1 wherein said detecting comprises filtering the sensed signal to pass the portion within a pass band about the power system frequency.

3. The method of claim 1 for further discriminating between at least first and second type power system interference sources, the method further comprising:
   spectrally analyzing the sensed signal to detect a further spectral characteristic specific to the first type power system interference source; and
   providing the operator indication when both the spectral characteristic related to power system interference sources and the further spectral characteristic specific to the first type power system interference source are detected.

4. The method of claim 3 wherein said first and second type power system interference sources are corona and spark discharge, respectively, said detecting the spectral characteristic and the further spectral characteristic comprises:

measuring a first portion of the sensed signal modulated at the power system frequency;

measuring a second portion of the sensed signal modulated at twice the power system frequency;

comparing the first portion against the second portion to detect that the first portion is at least a given ratio of the second portion; and providing the operator indication representative of corona when the first portion is detected to be at least the given ratio of the second portion.

5. A method of discriminating power system sources of interference from ambient interference and other interference sources, the method comprising:

sensing a signal from a targeted source;

spectrally analyzing the sensed signal to detect a spectral characteristic related to power system interference sources, wherein said spectrally analyzing comprises detecting the spectral characteristic that a portion of the sensed signal correlated to a power system frequency is at least a given proportion of the sensed signal; and providing an operator indication when the spectral characteristic is detected.

6. The method of claim 5 wherein said detecting comprises:

measuring a portion of the sensed signal modulated at the power system frequency;

measuring an aggregate value of the sensed signal; and comparing the measured portion to the measured aggregate value to detect the spectral characteristic.

7. A method of discriminating power system sources of interference from ambient interference and other interference sources, the method comprising:

sensing a signal from a targeted source;

detecting a portion of the sensed signal. in at least one spectral interval correlated to an electrical power frequency;

detecting an aggregate measure of the sensed signal;

comparing the detected portion in the at least one spectral interval to the aggregate measure; and indicating that the detected portion is at least a threshold proportion of the aggregate measure.

8. The method of claim 7 for further discriminating between at least first and second type power system interference sources, the method further comprising:

detecting portions of the sensed signal in first and second spectral intervals correlated to the electrical power frequency;

comparing the detected portions in the first and second spectral intervals; and indicating that the detected portion in the first spectral interval exceeds a threshold ratio of the detected portion in the second spectral interval.

9. The method of claim 8 wherein the types of power system interference sources include corona and sparking discharge sources, and wherein the spectral intervals include intervals about the electrical power frequency and about a harmonic of the electrical power frequency.

10. A method of pinpointing a location of an interference source, the method comprising:

sensing a signal from the source;

detecting a spectral signature of the sensed signal, the spectral signature including at least a value of the sensed signal modulated at a whole integer multiple of an electrical power frequency;

assessing similarity of the detected spectral signature to a known spectral signature of a power system interference source; and providing an operator perceptible indication of the similarity of the detected spectral signature to the known spectral signature.

11. The method of claim 10 wherein said detecting, assessing and providing comprises forming an audio signal based on filtering the sensed signal to within a pass band about the electrical power frequency.

12. The method of claim 10 wherein said detecting, assessing and providing comprises forming a signal strength measurement based on filtering the sensed signal to within a pass band about the electrical power frequency.

13. The method of claim 10 wherein said detecting, assessing and providing comprises producing an indication that the value of the sensed signal modulated at the whole integer multiple of the electrical power frequency exceeds a threshold proportion of an aggregate measure of the sensed signal.

14. The method of claim 10 wherein said detecting, assessing and providing comprises calculating a similarity measure of the similarity of the detected signature to the known signature, and producing an indication that the similarity measure exceeds a threshold.

15. The method of claim 10 wherein the spectral signature includes a first value of the sensed signal modulated at a first whole integer multiple of the electrical power frequency and a second value of the sensed signal modulated at a second whole integer multiple of the electrical power frequency, and wherein said assessing similarity and providing comprises:

comparing the first value with the second value; and indicating that the first value exceeds a threshold proportion of the second value.

16. A method of discriminantly identifying an interference source with discrimination from ambient interference, the method comprising:

receiving an ultrasonic signal;

pass band filtering the received signal within a pass band about a whole integer multiple of an electrical power frequency;

producing an operator-perceptible signal strength indication of a relative strength of the filtered signal;

producing an aggregate measure of the received signal;

producing a measure of the filtered signal;

comparing the aggregate measure and the filtered signal measure; and producing an operator-perceptible indication representative of whether the filtered signal measure exceeds a substantial proportion of the aggregate signal measure.

17. The method of claim 16 further comprising:

further pass band filtering the received signal within a further pass band about a further whole integer multiple of an electrical power frequency;

producing a measure of the further filtered signal;

comparing the filtered signal measure to the further filtered signal measure; and producing an operator-perceptible indication representative of whether the filtered signal measure also exceeds a ratio of the further filtered signal measure.

18. A device for locating power line faults with improved sensitivity to and discrimination of spark discharge and corona from non-power line sources, the device comprising:
- an ultrasonic transducer;
- an amplifier coupled to the ultrasonic transducer;
- a pass band filter having a pass band about a whole integer multiple of an electrical power frequency; and
- an indicator producing an operator-perceptible indication of a strength of a signal produced from the ultrasonic transducer and amplifier within the pass band of the pass band filter.

19. The device of claim 18 wherein the indicator comprises an audio amplifier and a speaker for producing an audio signal indication to the operator of the signal strength within the pass band.

20. The device of claim 18 wherein the indicator comprises a signal strength meter for producing a visual meter indication to the operator of the signal strength within the pass band.

21. The device of claim 18 wherein the indicator comprises a comparator circuit for measuring a proportion of the signal within the pass band relative to an aggregate measure of the signal as a whole, and an operator-perceptible indication device for producing an indication to the operator when the measured proportion exceeds a threshold.

22. The device of claim 18 further comprising:
- a second pass band filter having a second pass band about a second whole integer multiple of an electrical power frequency;
- a comparator for comparing the signal within the pass bands of the first and second pass band filters; and
- a second indicator producing an operator-perceptible indication when a ratio of the signal with the pass bands exceeds a threshold.

23. A device for detecting an interference source, the device comprising:
- an ultrasonic sensor operating to produce a signal representative of ultrasonic shocks emanating from a targeted source;
- a signal processing circuit operating to process the sensor signal and produce a spectral signature of the sensor signal, the spectral signature including at least a value representative of the ultrasonic shocks modulated at a whole integer multiple of an electrical power frequency;
- a spectral characteristic comparator operating to assess similarity of the detected spectral signature to a reference spectral signature of a power system interference source; and
- an indicator operating to provide an operator perceptible indication of the similarity of the detected spectral signature to the known spectral signature.

24. The device of claim 23 wherein the ultrasonic sensor is mounted in a parabola for directional ultrasonic sensing.

25. The device of claim 23 wherein the ultrasonic sensor is a contact sensor.

26. The device of claim 23 further comprising an adapter circuit operative to connect the signal processing circuit to a radio frequency antenna, and convert a radio frequency signal from the antenna to an ultrasonic signal for processing in the signal processing circuit.

27. The device of claim 23 further comprising an adapter circuit operative to connect the signal processing circuit to an audio or video signal output, and convert a signal at the audio or video signal output to a level and frequency range signal for processing in the signal processing circuit.

28. The device of claim 23 wherein the signal processing circuit comprises a digital signal processor operating to calculate a Fast Fourier Transform of the sensor signal to produce the spectral signature over a frequency range including the whole integer multiple of an electrical power frequency.

29. The device of claim 28 further comprising:
- a reference signature store operating to store a reference spectral signature;
- the spectral characteristic comparator operating to calculate a similarity measure as a sum of squares of differences between the spectral signal of the sensor signal and the stored reference spectral signature at a plurality of the values in the signatures.

30. The device of claim 23 wherein the signal processing circuit comprises at least one pass band filter operating to filter the sensor signal within a pass band.

31. The device of claim 30 wherein the at least one pass band filter comprises first and second pass band filters operating to filter the sensor signal within respective first and second pass bands about respective first and second whole integer multiples of the electrical power frequency, and wherein the spectral characteristic comparator operates to compare the portions of the signal passed by the first and second pass band filters to distinguish corona and spark discharge sources.

32. A device for detecting an, interference source, the device comprising:
- an adapter circuit for connecting to at least one of a radio frequency signal, audio signal and video signal source and converting said signal to an ultrasonic frequency range or audio range signal;
- a signal processing circuit operating to process said signal from the adapter circuit and produce a spectral signature of the ultrasonic frequency range signal, the spectral signature including at least a value representative of ultrasonic shocks modulated at a whole integer multiple of an electrical power frequency;
- a spectral characteristic comparator operating to assess similarity of the detected spectral signature to a reference spectral signature of a power system interference source; and
- an indicator operating to provide an operator perceptible indication of the similarity of the detected spectral signature to the known spectral signature.

* * * * *